(12) United States Patent
Pagaila et al.

(10) Patent No.: US 9,318,441 B2
(45) Date of Patent: Apr. 19, 2016

(54) SEMICONDUCTOR DEVICE AND METHOD OF FORMING SACRIFICIAL ADHESIVE OVER CONTACT PADS OF SEMICONDUCTOR DIE

(75) Inventors: Reza A. Pagaila, Tangerang (ID); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 390 days.

(21) Appl. No.: 12/794,598

(22) Filed: Jun. 4, 2010

(65) Prior Publication Data

US 2011/0298137 A1 Dec. 8, 2011
US 2014/0252631 A9 Sep. 11, 2014

Related U.S. Application Data

(63) Continuation-in-part of application No. 11/957,101, filed on Dec. 14, 2007, now Pat. No. 7,767,496.

(51) Int. Cl.
*H01L 23/52* (2006.01)
*H01L 21/50* (2006.01)
(Continued)

(52) U.S. Cl.
CPC .......... *H01L 23/5389* (2013.01); *H01L 21/561* (2013.01); *H01L 21/563* (2013.01); *H01L 21/568* (2013.01); *H01L 23/49816* (2013.01);
(Continued)

(58) Field of Classification Search
CPC ... H01L 21/561; H01L 21/563; H01L 21/568; H01L 23/5389; H01L 24/19; H01L 24/20; H01L 24/97; H01L 2221/68359; H01L 2224/04105; H01L 2224/13022; H01L 2224/214; H01L 2224/221

USPC .......... 257/E21.503, E21.502, 773, E21, 499, 257/E23.141; 438/106–127

See application file for complete search history.

(56) References Cited

U.S. PATENT DOCUMENTS

| 4,894,115 A | 1/1990 | Eichelberger et al. |
| 5,157,001 A | 10/1992 | Sakuma |

(Continued)

FOREIGN PATENT DOCUMENTS

| CN | 1246731 A | 3/2000 |
| CN | 101192550 A | 6/2008 |

(Continued)

*Primary Examiner* — Asok K Sarkar
*Assistant Examiner* — Dmitriy Yemelyanov
(74) *Attorney, Agent, or Firm* — Robert D. Atkins; Patent Law Group: Atkins and Associates, P.C.

(57) ABSTRACT

A semiconductor wafer contains a plurality of semiconductor die each having a plurality of contact pads. A sacrificial adhesive is deposited over the contact pads. Alternatively, the sacrificial adhesive is deposited over the carrier. An underfill material can be formed between the contact pads. The semiconductor wafer is singulated to separate the semiconductor die. The semiconductor die is mounted to a temporary carrier such that the sacrificial adhesive is disposed between the contact pads and temporary carrier. An encapsulant is deposited over the semiconductor die and carrier. The carrier and sacrificial adhesive is removed to leave a via over the contact pads. An interconnect structure is formed over the encapsulant. The interconnect structure includes a conductive layer which extends into the via for electrical connection to the contact pads. The semiconductor die is offset from the interconnect structure by a height of the sacrificial adhesive.

27 Claims, 16 Drawing Sheets

(51) Int. Cl.
*H01L 21/56* (2006.01)
*H01L 23/538* (2006.01)
*H01L 23/498* (2006.01)
*H01L 23/00* (2006.01)
*H01L 23/31* (2006.01)

(52) U.S. Cl.
CPC ............... *H01L 24/19* (2013.01); *H01L 24/20* (2013.01); *H01L 24/96* (2013.01); *H01L 24/97* (2013.01); *H01L 23/3128* (2013.01); *H01L 24/48* (2013.01); *H01L 2221/68359* (2013.01); *H01L 2224/0401* (2013.01); *H01L 2224/04105* (2013.01); *H01L 2224/11849* (2013.01); *H01L 2224/12105* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/214* (2013.01); *H01L 2224/221* (2013.01); *H01L 2224/48091* (2013.01); *H01L 2224/73203* (2013.01); *H01L 2224/73265* (2013.01); *H01L 2224/96* (2013.01); *H01L 2224/97* (2013.01); *H01L 2924/01004* (2013.01); *H01L 2924/014* (2013.01); *H01L 2924/01013* (2013.01); *H01L 2924/01029* (2013.01); *H01L 2924/01047* (2013.01); *H01L 2924/01049* (2013.01); *H01L 2924/01061* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/181* (2013.01)

(56) References Cited

U.S. PATENT DOCUMENTS

| | | | |
|---|---|---|---|
| 5,161,093 | A | 11/1992 | Gorczyca et al. |
| 5,250,843 | A | 10/1993 | Eichelberger |
| 5,353,498 | A | 10/1994 | Fillion et al. |
| 5,527,741 | A | 6/1996 | Cole et al. |
| 5,703,400 | A | 12/1997 | Wojnarowski et al. |
| 5,814,193 | A | 9/1998 | Crowe |
| 5,834,340 | A | 11/1998 | Sawai et al. |
| 5,841,193 | A | 11/1998 | Eichelberger |
| 5,866,952 | A | 2/1999 | Wojnarowski et al. |
| 6,025,995 | A | 2/2000 | Marcinkiewicz |
| 6,028,364 | A | 2/2000 | Ogino et al. |
| 6,110,773 | A | 8/2000 | Lee |
| 6,168,966 | B1 | 1/2001 | Fan et al. |
| 6,187,615 | B1 | 2/2001 | Kim et al. |
| 6,197,613 | B1 | 3/2001 | Kung et al. |
| 6,271,469 | B1 | 8/2001 | Ma et al. |
| 6,351,031 | B1 | 2/2002 | Iijima et al. |
| 6,423,571 | B2 | 7/2002 | Ogino et al. |
| 7,008,822 | B2 | 3/2006 | Bolken et al. |
| 7,165,316 | B2 | 1/2007 | Fjelstad |
| 7,189,596 | B1 | 3/2007 | Mu et al. |
| 7,192,807 | B1 | 3/2007 | Huemoeller et al. |
| 7,514,767 | B2 | 4/2009 | Yang |
| 7,569,427 | B2 | 8/2009 | Theuss |
| 7,598,117 | B2 | 10/2009 | Kurita et al. |
| 7,619,901 | B2 | 11/2009 | Eichelberger et al. |
| 7,642,128 | B1 | 1/2010 | Lin et al. |
| 7,657,157 | B2 | 2/2010 | Okabayashi et al. |
| 7,666,709 | B1* | 2/2010 | Lin et al. .................. 438/106 |
| 7,675,157 | B2 | 3/2010 | Liu et al. |
| 7,767,496 | B2 | 8/2010 | Shim et al. |
| 7,888,238 | B2 | 2/2011 | Wakisaka et al. |
| 7,915,690 | B2 | 3/2011 | Shen |
| 8,012,807 | B2 | 9/2011 | Meyer et al. |
| 8,035,231 | B2 | 10/2011 | Kurita et al. |
| 8,039,303 | B2 | 10/2011 | Shim et al. |
| 8,097,489 | B2 | 1/2012 | Pagaila et al. |
| 8,188,584 | B1 | 5/2012 | Berry et al. |
| 8,193,647 | B2 | 6/2012 | Hsieh et al. |
| 8,258,633 | B2 | 9/2012 | Sezi et al. |
| 2003/0141105 | A1 | 7/2003 | Sugaya et al. |
| 2004/0056344 | A1 | 3/2004 | Ogawa et al. |
| 2004/0110316 | A1 | 6/2004 | Ogihara et al. |
| 2004/0219717 | A1 | 11/2004 | Takahashi et al. |
| 2005/0121771 | A1* | 6/2005 | Lin et al. .................. 257/700 |
| 2006/0046347 | A1* | 3/2006 | Wood et al. ............... 438/106 |
| 2006/0063312 | A1 | 3/2006 | Kurita |
| 2006/0084240 | A1 | 4/2006 | Poo et al. |
| 2006/0125072 | A1 | 6/2006 | Mihara |
| 2007/0035015 | A1 | 2/2007 | Hsu |
| 2007/0035033 | A1 | 2/2007 | Ozguz et al. |
| 2007/0040258 | A1* | 2/2007 | Sheats .......................... 257/686 |
| 2007/0141759 | A1 | 6/2007 | Nagase et al. |
| 2007/0178622 | A1 | 8/2007 | Liu et al. |
| 2007/0249153 | A1 | 10/2007 | Dong |
| 2008/0006900 | A1 | 1/2008 | Chan et al. |
| 2008/0012144 | A1 | 1/2008 | Meyer et al. |
| 2008/0054426 | A1 | 3/2008 | Ohno et al. |
| 2008/0090335 | A1 | 4/2008 | Morimoto et al. |
| 2008/0136004 | A1 | 6/2008 | Yang et al. |
| 2008/0188037 | A1 | 8/2008 | Lin |
| 2008/0217761 | A1 | 9/2008 | Yang et al. |
| 2008/0246126 | A1 | 10/2008 | Bowles et al. |
| 2008/0265383 | A1 | 10/2008 | Brunnbauer et al. |
| 2008/0313894 | A1* | 12/2008 | Fillion et al. ................ 29/840 |
| 2008/0315385 | A1 | 12/2008 | Gerber et al. |
| 2009/0140442 | A1 | 6/2009 | Lin |
| 2009/0146282 | A1* | 6/2009 | Tay et al. .................... 257/686 |
| 2009/0152715 | A1* | 6/2009 | Shim et al. ................. 257/737 |
| 2009/0309212 | A1* | 12/2009 | Shim et al. ................. 257/700 |
| 2010/0258937 | A1 | 10/2010 | Shim et al. |
| 2011/0095404 | A1 | 4/2011 | Yamano et al. |
| 2011/0114950 | A1 | 5/2011 | Huang |
| 2011/0198762 | A1 | 8/2011 | Scanlan |
| 2011/0221055 | A1 | 9/2011 | Lin et al. |
| 2011/0221057 | A1 | 9/2011 | Lin et al. |
| 2011/0244657 | A1 | 10/2011 | Grivna et al. |
| 2011/0254156 | A1 | 10/2011 | Lin |
| 2011/0256690 | A1 | 10/2011 | Huang |

FOREIGN PATENT DOCUMENTS

| | | |
|---|---|---|
| CN | 101261984 A | 9/2008 |
| CN | 101752273 A | 6/2010 |
| JP | 2007184636 A | 7/2007 |

* cited by examiner

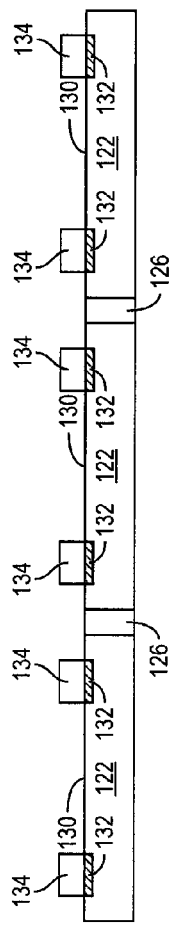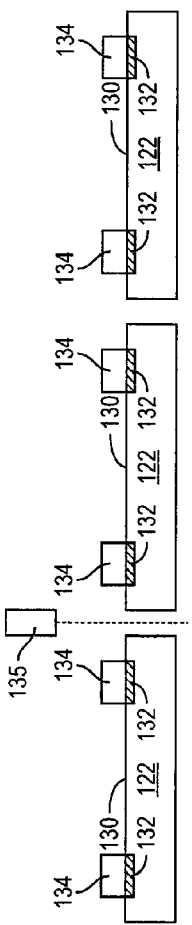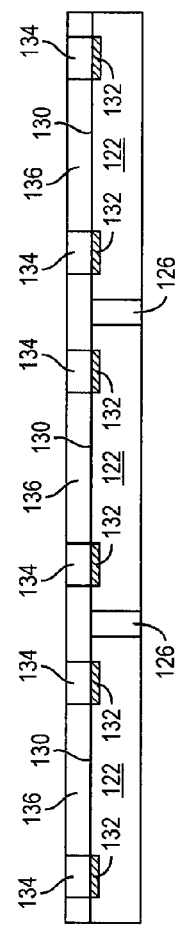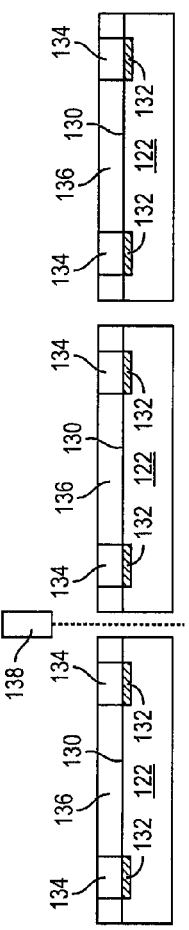
FIG. 3c
FIG. 3d
FIG. 3e
FIG. 3f

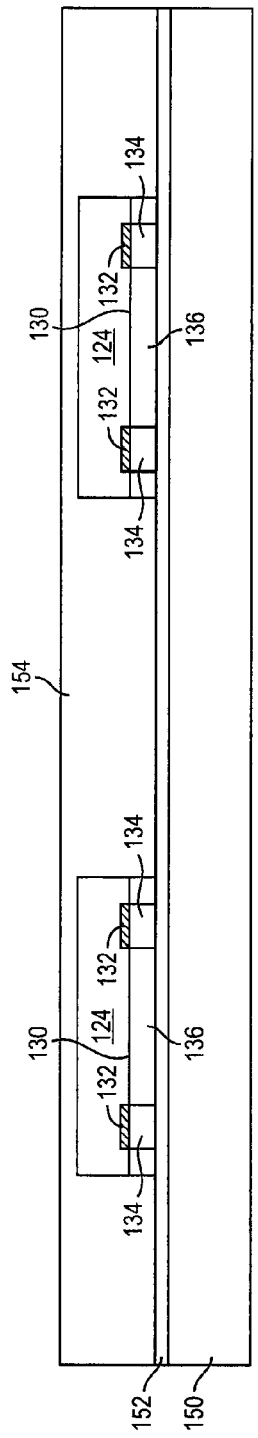
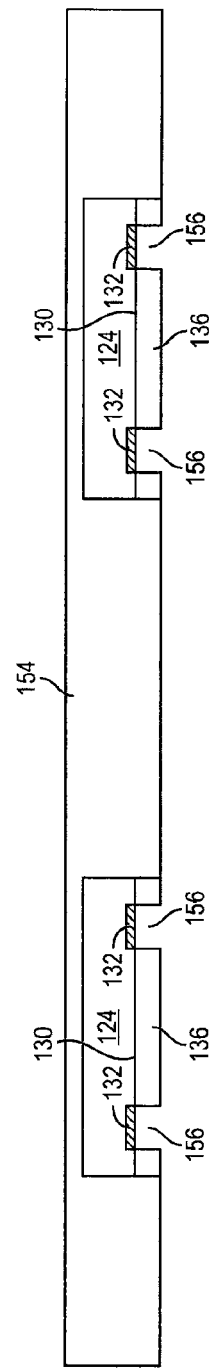
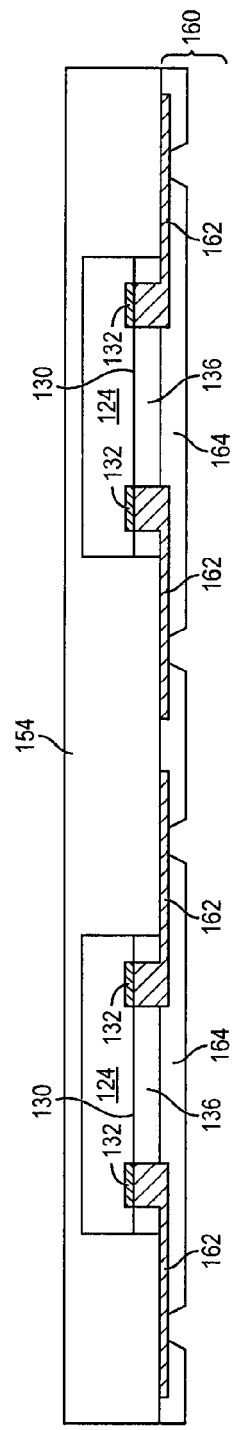
FIG. 5d
FIG. 5e
FIG. 5f

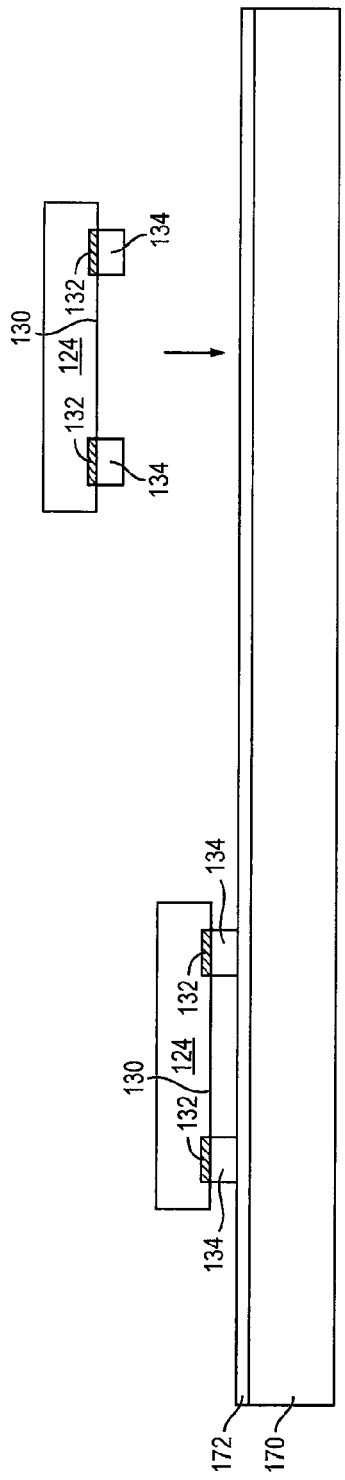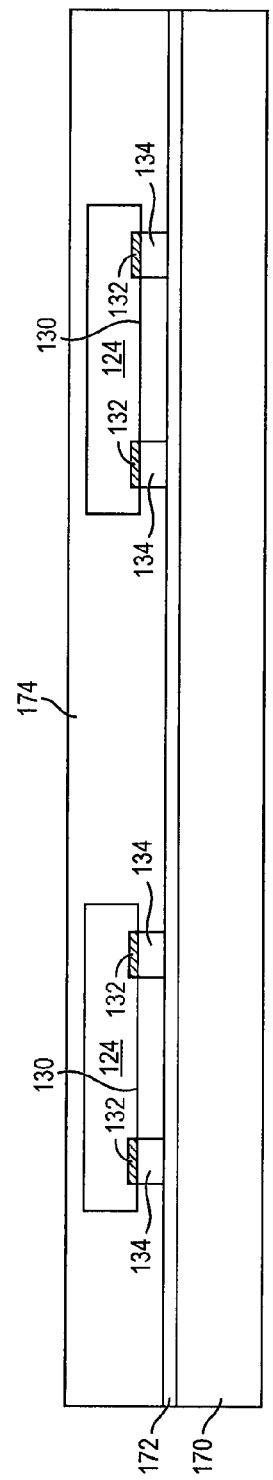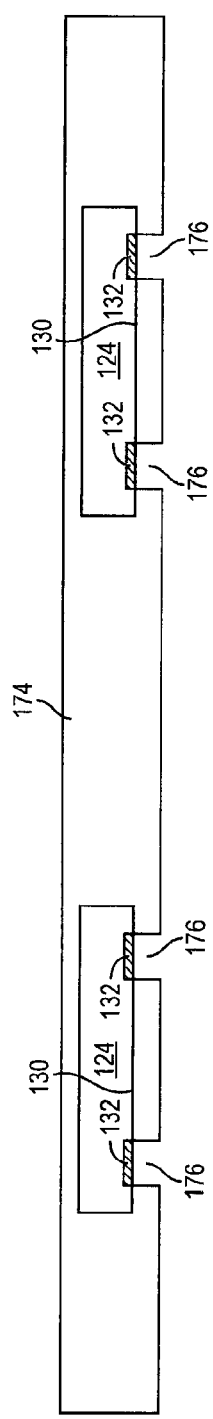

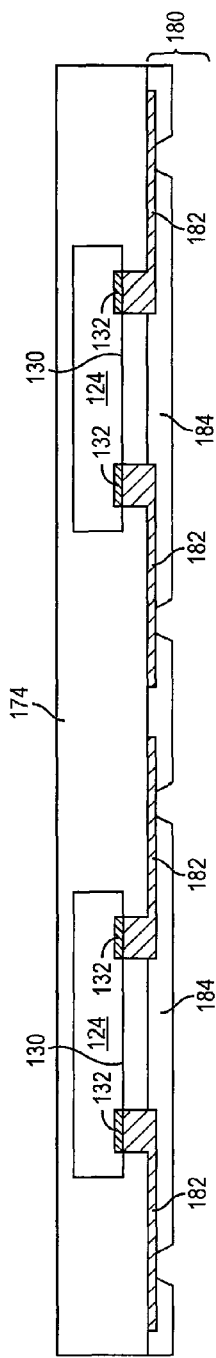
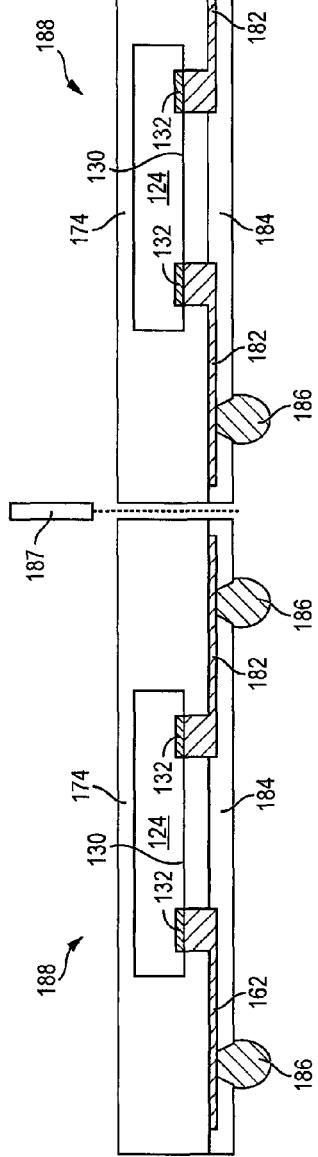
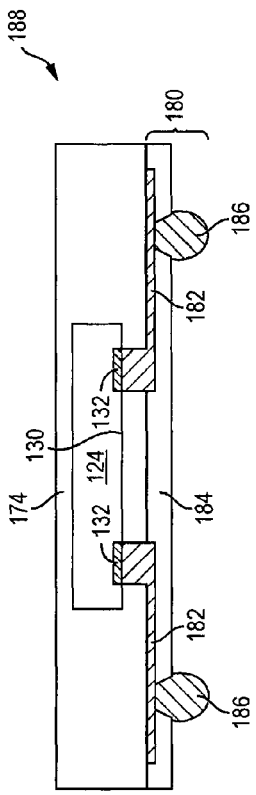
FIG. 7d
FIG. 7e
FIG. 8

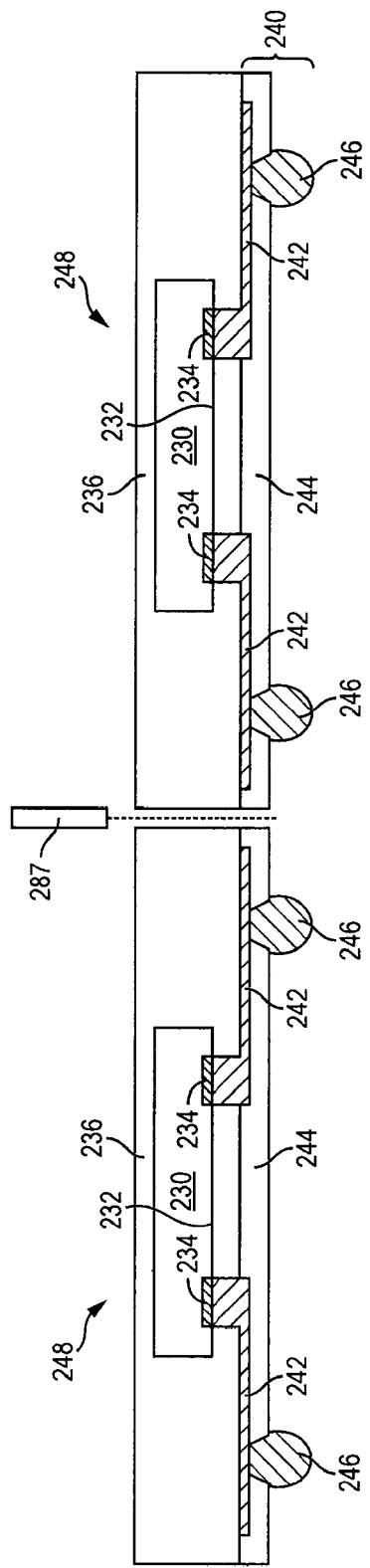

SEMICONDUCTOR DEVICE AND METHOD OF FORMING SACRIFICIAL ADHESIVE OVER CONTACT PADS OF SEMICONDUCTOR DIE

The present application is a continuation-in-part of U.S. patent application Ser. No. 11/957,101, now U.S. Pat. No. 7,767,496, filed Dec. 14, 2007.

FIELD OF THE INVENTION

The present invention relates in general to semiconductor devices and, more particularly, to a semiconductor device and method of forming sacrificial adhesive over contact pads of a semiconductor die. After the sacrificial adhesive is removed, a conductive layer within the interconnect structure extends into the via for electrical connection to the contact pads.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

A semiconductor wafer typically contains a plurality of semiconductor die. In a fan-out wafer level chip scale package (FO-WLCSP), the semiconductor die is singulated from the wafer and mounted to a temporary support carrier. An encapsulant or molding compound is deposited over the semiconductor die for environmental protection from external elements and contaminants. The encapsulation process imposes forces on the semiconductor die as the encapsulant is deposited around the die. The forces can cause vertical or lateral shifting or movement of the semiconductor die.

To reduce die shifting, bumps can be formed over the die while in wafer form and wettable contact pads can be formed over the carrier. The die bumps are bonded to the wettable contact pads on the carrier to hold the die in place during encapsulation. However, wafer bumping and patterning solder-wettable pads involves time consuming and costly manufacturing processes, such as photolithography and plating. In addition, non-uniform bumps on wafer must be reworked.

Following encapsulation, the temporary carrier and adhesive layer are removed and a build-up interconnect structure is formed over the semiconductor die and encapsulant. Bump cracking often occurs due to CTE mismatch between the semiconductor die, bumps, and interconnect structure formed over the encapsulant.

SUMMARY OF THE INVENTION

A need exists for reliable and cost effective electrical connection between contact pads of the semiconductor die and interconnect structure. Accordingly, in one embodiment, the present invention is a method of making a semiconductor device comprising the steps of providing a semiconductor wafer containing a plurality of semiconductor die each having a plurality of contact pads, depositing sacrificial adhesive over the contact pads, singulating the semiconductor wafer to separate the semiconductor die, providing a temporary carrier, mounting the semiconductor die to the temporary carrier such that the sacrificial adhesive is disposed between the contact pads and temporary carrier, depositing an encapsulant over the semiconductor die and temporary carrier, removing the temporary carrier and sacrificial adhesive to leave a via over the contact pads, and forming an interconnect structure over the encapsulant. The interconnect structure includes a plurality of conductive layers and insulating layer formed between the conductive layers. A portion of the conductive layer extends into the via for electrical connection to the contact pads.

In another embodiment, the present invention is a method of making a semiconductor device comprising the steps of providing a semiconductor die having a plurality of contact pads, providing a carrier, depositing sacrificial adhesive over the carrier, mounting the semiconductor die to the carrier such that the sacrificial adhesive is disposed between the contact pads and carrier, depositing an encapsulant over the semiconductor die and carrier, removing the carrier and sacrificial adhesive to leave a via over the contact pads, and forming an interconnect structure over the encapsulant. The interconnect structure includes a conductive layer which extends into the via for electrical connection to the contact pads.

In another embodiment, the present invention is a method of making a semiconductor device comprising the steps of providing a semiconductor die having a contact pad, providing a carrier, mounting the semiconductor die to the carrier with sacrificial adhesive disposed between the contact pad and carrier, depositing an encapsulant over the semiconductor die and carrier, removing the carrier and sacrificial adhesive to leave a via over the contact pad, and forming an interconnect structure over the encapsulant. The interconnect structure includes a conductive layer which extends into the via for electrical connection to the contact pad.

In another embodiment, the present invention is a semiconductor device comprising a semiconductor die having a plurality of contact pads. A sacrificial adhesive is formed over the contact pads. An encapsulant is deposited over the semiconductor die. An interconnect structure has a conductive layer formed over the encapsulant. The sacrificial adhesive is removed to form a via over the contact pad and the conductive layer extends into the via for electrical connection to the contact pad.

BRIEF DESCRIPTION OF THE DRAWINGS

FIGS. 3a-3f illustrate a process of forming sacrificial adhesive over contact pads of a semiconductor die;

FIGS. 5a-5g illustrate forming the conductive layer of the interconnect structure to extend to the contact pads of the semiconductor die upon removal of the sacrificial adhesive;

FIGS. 7a-7e illustrate the conductive layer extending to the contact pads with an encapsulant deposited under the semiconductor die;

FIG. 8 illustrates another WLCSP with the conductive layer extending to the contact pads and an encapsulant deposited under the semiconductor die;

FIGS. 10a-10g illustrate forming the sacrificial adhesive over the carrier and forming the conductive layer to extend to the contact pads with an encapsulant under the die.

DETAILED DESCRIPTION OF THE DRAWINGS

Figure 1:
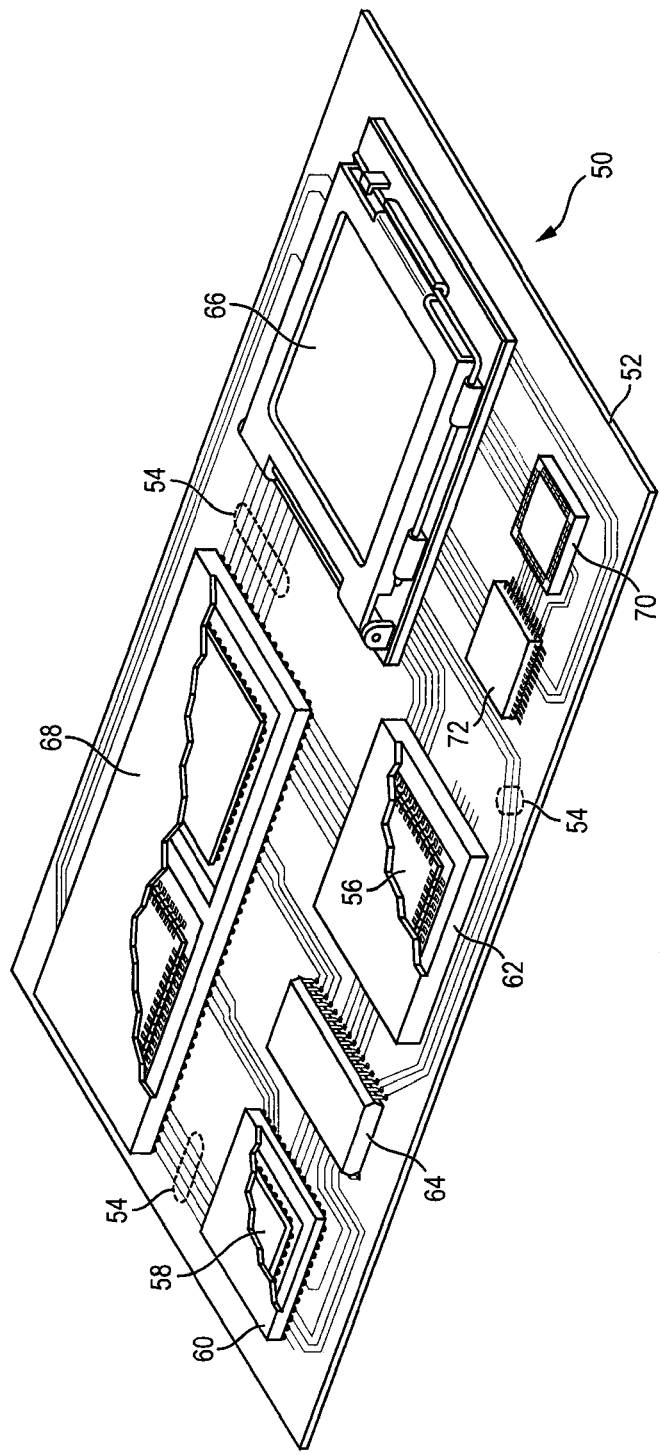
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade.

After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
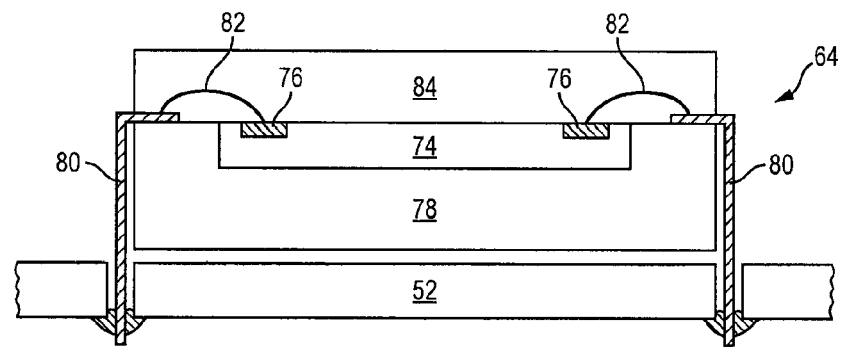
FIGS. 2a-2c illustrate further detail of the representative semiconductor packages mounted to the PCB.
Figure 2B:
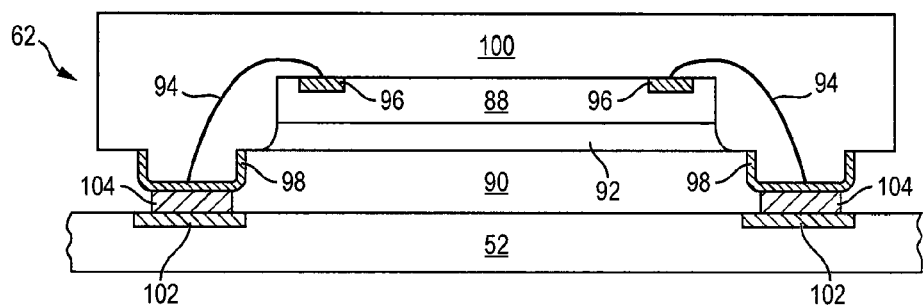
Figure 2C:
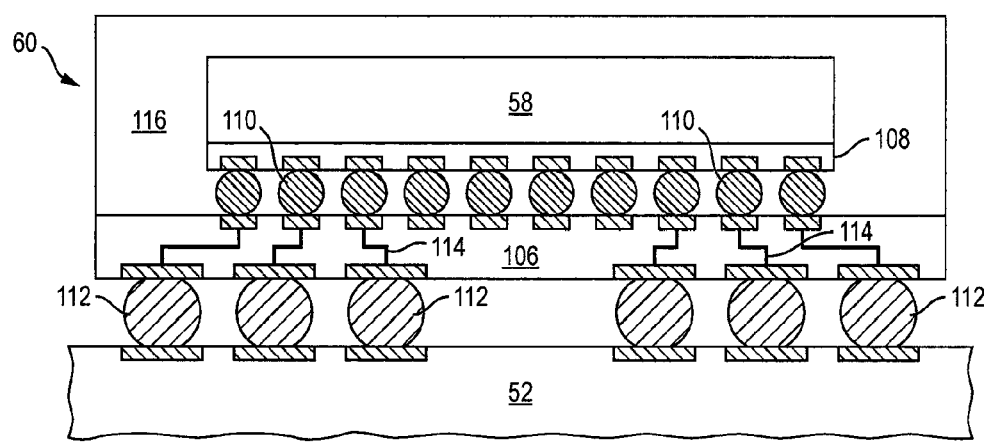

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
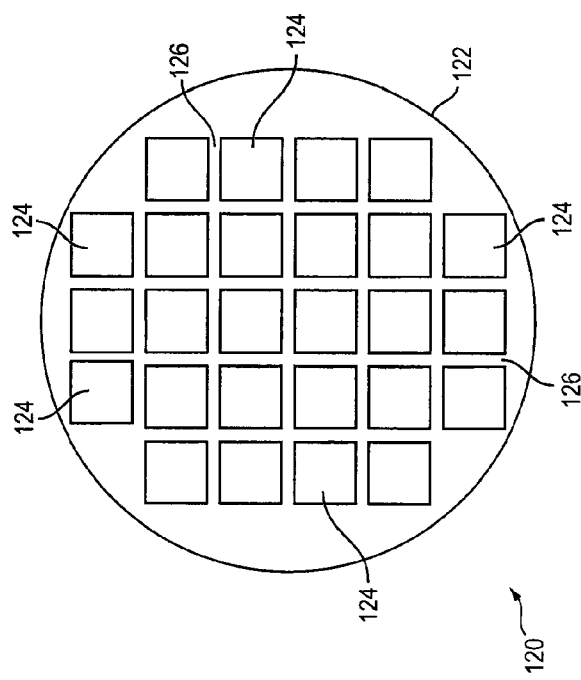

FIGS. 3a-3f illustrate a process of forming sacrificial adhesive over contact pads of a semiconductor die. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
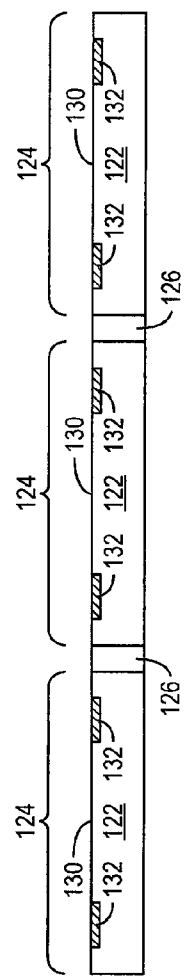

FIG. 3b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

In FIG. 3c, a sacrificial adhesive 134, such as ultraviolet (UV) or heat releasable polymer adhesive, is deposited over contact pads 132 on semiconductor wafer 120 by screen printing or other suitable application process.

In FIG. 3d, semiconductor wafer 120 is singulated through saw street 126 using saw blade or laser cutting tool 135 into individual semiconductor die 124. Each semiconductor die 124 has sacrificial adhesive 134 over contacts pads 132.

In another embodiment, continuing from FIG. 3c, an underfill material 136, such as epoxy resin, is deposited over active surface 130 between sacrificial adhesive 134, as shown in FIG. 3e. The top surface of underfill material 136 and sacrificial adhesive 134 is planarized.

In FIG. 3f, semiconductor wafer 120 is singulated through saw street 126 using saw blade or laser cutting tool 138 into individual semiconductor die 124. Each semiconductor die 124 has sacrificial adhesive 134 over contacts pads 132 and underfill material 136 over active surface 130.

Figure 4A:
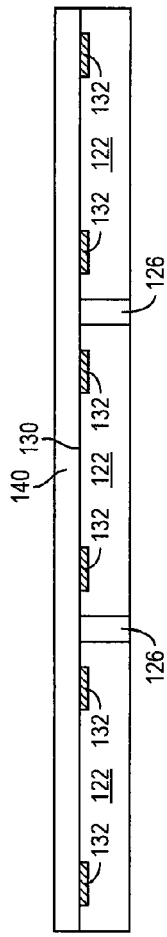
FIGS. 4a-4d illustrate another process of forming the sacrificial adhesive over contact pads of a semiconductor die.
Figure 4B:
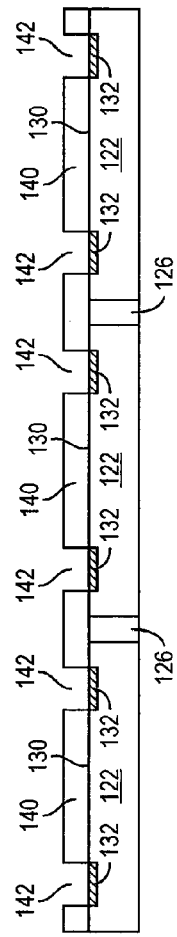
Figure 4C:
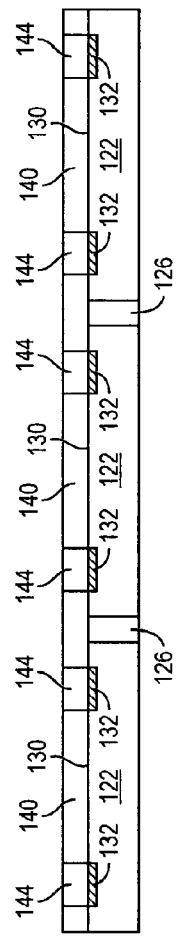

In another embodiment, continuing from FIG. 3b, an underfill material 140, such as epoxy resin, is deposited over active surface 130 of semiconductor wafer 120, as shown in FIG. 4a. A plurality of vias 142 is formed through underfill material 140 over contact pads 132 using an etching process, as shown in FIG. 4b. In FIG. 4c, vias 142 are filled with sacrificial adhesive 144, such as UV or heat releasable polymer adhesive, by screen printing, needle dispensing, or other suitable application process. The top surface of underfill material 136 and sacrificial adhesive 144 is planarized.

Figure 4D:
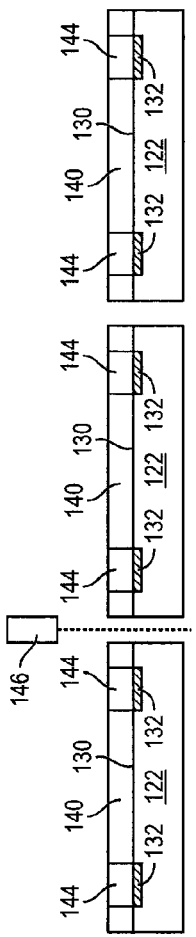

In FIG. 4d, semiconductor wafer 120 is singulated through saw street 126 using saw blade or laser cutting tool 146 into individual semiconductor die 124. Each semiconductor die 124 has sacrificial adhesive 144 over contacts pads 132 and underfill material 140 over active surface 130, similar to FIG. 3f.

Figure 5A:

FIGS. 5a-5g illustrate, in relation to FIGS. 1 and 2a-2c, a process of forming the conductive layer of the interconnect structure to extend to the contact pads of the semiconductor die after removal of the sacrificial adhesive. In FIG. 5a, a temporary substrate or carrier 150 contains sacrificial base material such as silicon, polymer, polymer composite, metal, ceramic, glass, glass epoxy, beryllium oxide, or other suitable low-cost, rigid material for structural support. An interface layer or tape 152 is applied over carrier 150 as a temporary adhesive bonding film releasable by heat or ultraviolet (UV) light.

Figure 5B:
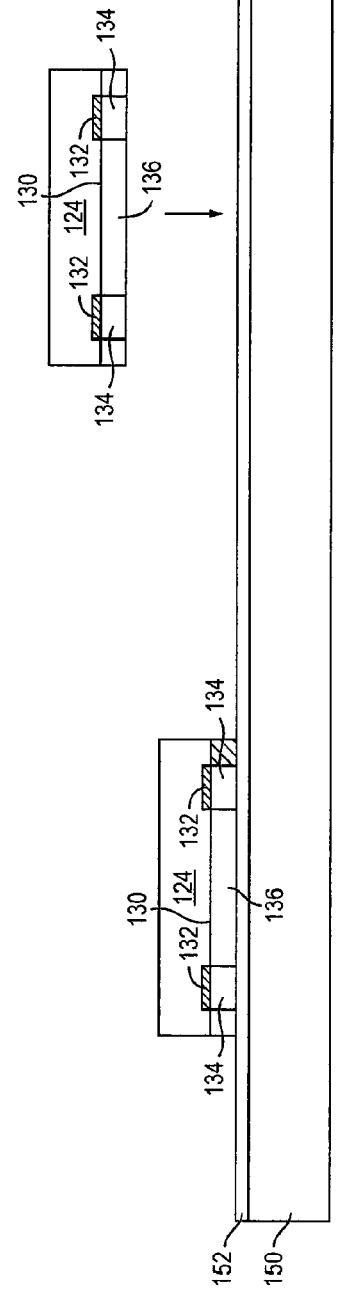
Figure 5C:
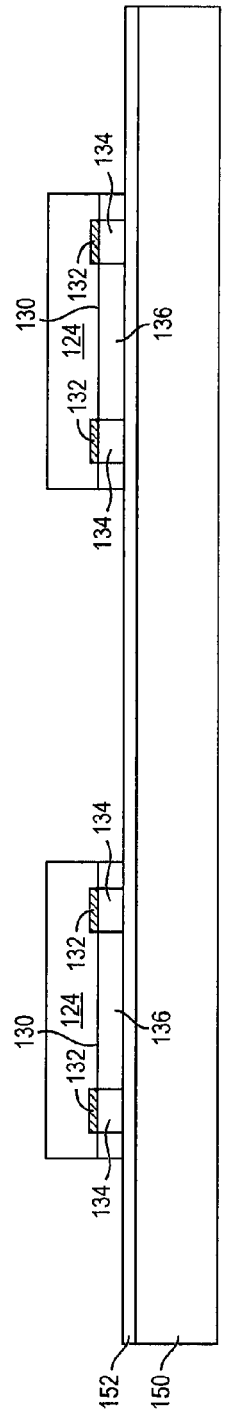

In FIG. 5b, semiconductor die 124 with the sacrificial adhesive over contact pads 132 and underfill material over active surface 130, either from the wafer processing option of FIGS. 3a-3c and 3e-3f or from the wafer processing option of FIGS. 4a-4d, are mounted to interface layer 152 using a pick and place operation. The sacrificial adhesive and underfill material are oriented toward carrier 150. FIG. 5c shows all semiconductor die 124 mounted to carrier 150 with sacrificial adhesive 134 and underfill material 136 contacting interface layer 152. Active surface 130 is offset from carrier 150 by a height of sacrificial adhesive 134. In one embodiment, sacrificial adhesive 134 has a height of 5-75 micrometers (μm).

In FIG. 5d, an encapsulant or molding compound 154 is deposited over semiconductor die 124 and carrier 150 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants. Sacrificial adhesive 134 holds semiconductor die 124 securely in place, reducing lateral or vertical shifting of the die, while encapsulant 154 is deposited and cured.

In FIG. 5e, carrier 150 and interface layer 152 are removed by UV light, thermal bake, chemical etching, mechanical peel-off, CMP, mechanical grinding, laser scanning, or wet stripping. Sacrificial adhesive 134 is also removed, leaving vias 156 which extend to contact pads 132.

In FIG. 5f, a build-up interconnect structure 160 is formed over encapsulant 154 and underfill material 136. The build-up interconnect structure 160 includes an electrically conductive layer or redistribution layer (RDL) 162 formed using a patterning and metal deposition process such as sputtering, electrolytic plating, and electroless plating. Conductive layer 162 can be one or more layers of Al, Cu, Sn, Ni, Au, Ag, or other suitable electrically conductive material. One portion of conductive layer 162 extends into vias 156 for electrical connection to contact pads 132. Conductive layer 162 may partially or completely fill vias 156. Other portions of conductive layer 162 can be electrically common or electrically isolated depending on the design and function of semiconductor die 124.

The build-up interconnect structure 160 further includes an insulating or passivation layer 164 formed between conductive layers 162 for electrical isolation. The insulating layer 164 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 164 is formed using PVD, CVD, printing, spin coating, spray coating, sintering or thermal oxidation. A portion of insulating layer 164 is removed by an etching process to expose conductive layer 162 for bump formation or additional package interconnect.

Figure 5G:
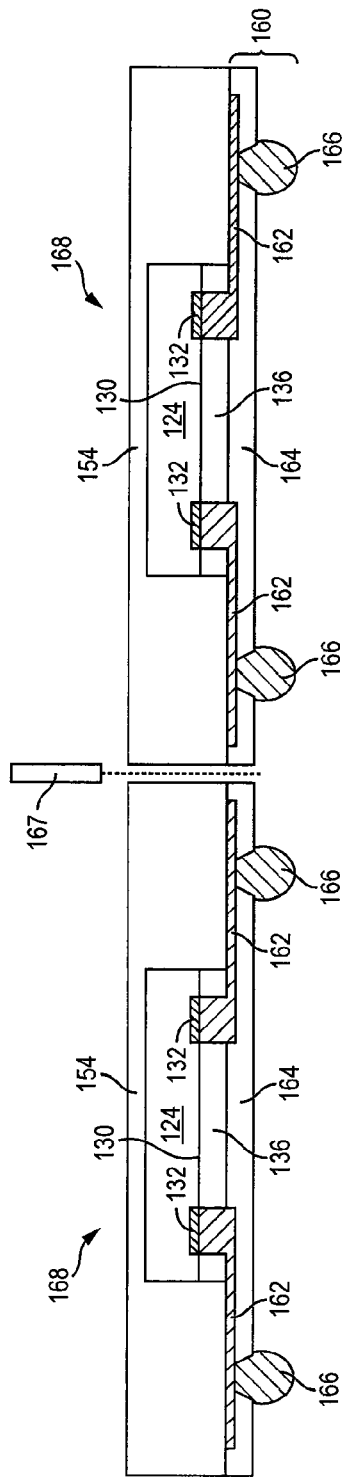

In FIG. 5g, an electrically conductive bump material is deposited over build-up interconnect structure 160 and electrically connected to conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or bumps 166. In some applications, bumps 166 are reflowed a second time to improve electrical contact to conductive layer 162. An under bump metallization (UBM) can be formed under bumps 166. The bumps can also be compression bonded to conductive layer 162. Bumps 166 represent one type of interconnect structure that can be formed over conductive layer 162. The interconnect structure can also use bond wires, stud bump, micro bump, or other electrical interconnect.

Figure 6:
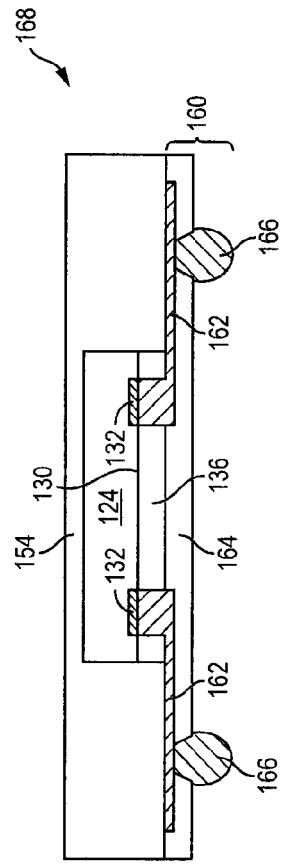
FIG. 6 illustrates a WLCSP with the conductive layer of the interconnect structure extending to the contact pads of the semiconductor die.

The encapsulant 154 and interconnect structure 160 are singulated using saw blade or laser cutting tool 167 into individual FO-WLCSP 168. FIG. 6 shows FO-WLCSP 168 after singulation. Semiconductor die 124 is electrically connected to conductive layer 162 of interconnect structures 160 and bumps 166. Sacrificial adhesive 134 is formed over contact pads 132 prior to mounting semiconductor die 124 to carrier 150 for encapsulation and formation of interconnect structure 160. Sacrificial adhesive 134 holds semiconductor die 124 securely in place, reducing lateral or vertical shifting of the die, while encapsulant 154 is deposited and cured. Active surface 130 is offset from interconnect structure 160 by a height of sacrificial adhesive 134. Sacrificial adhesive 134 is removed with carrier 150 but leaves behind via 156 as an opening through underfill material 136 extending to contact pad 132. Conductive layer 162 is formed in via 156 to electrically connect semiconductor die 124 to interconnect structure 160 and bumps 166, without forming bumps over contact pads 132. Since conductive layer 162 is formed to extend to contact pads 132, no separate via formation is needed to make the electrical connection to the contact pads. The interconnect resistance is reduced by directly connecting conductive layer 162 to contact pads 132. By avoiding wafer-level bump formation over contact pads 132, wafer-level bump rework can be omitted. In addition, no solder-wettable contact pads are needed over the carrier to hold the semiconductor die in place during encapsulation, which saves manufacturing costs and reduces risk of bump cracking.

FIGS. 7a-7e show another embodiment with a temporary substrate or carrier 170 containing sacrificial base material such as silicon, polymer, polymer composite, metal, ceramic, glass, glass epoxy, beryllium oxide, or other suitable low-cost, rigid material for structural support. An interface layer or tape 172 is applied over carrier 170 as a temporary adhesive bonding film releasable by heat or UV light. Semiconductor die 124 with sacrificial adhesive 134 formed over contact pads 132, from the wafer processing option of FIGS. 3a-3d, are mounted to interface layer 172 using a pick and place operation, as shown in FIG. 7a. Sacrificial adhesive 134 is oriented toward carrier 160. Active surface 130 is offset from carrier 170 by a height of sacrificial adhesive 134.

In FIG. 7b, an encapsulant or molding compound 174 is deposited over semiconductor die 124 and carrier 170 using a paste printing, compressive molding, transfer molding, liquid encapsulant molding, vacuum lamination, spin coating, or other suitable applicator. Encapsulant 174 can be polymer composite material, such as epoxy resin with filler, epoxy acrylate with filler, or polymer with proper filler. Encapsulant 174 is non-conductive and environmentally protects the semiconductor device from external elements and contaminants. Encapsulant 174 underfills semiconductor die 124. Sacrificial adhesive 134 holds semiconductor die 124 securely in place, reducing lateral or vertical shifting of the die, while encapsulant 154 is deposited and cured.

In FIG. 7c, carrier 170 and interface layer 172 are removed by UV light, thermal bake, chemical etching, mechanical peel-off, CMP, mechanical grinding, laser scanning, or wet stripping. Sacrificial adhesive 134 is also removed, leaving vias 176 which extend to contact pads 132.

In FIG. 7d, a build-up interconnect structure 180 is formed over encapsulant 174. The build-up interconnect structure 180 includes an electrically conductive layer or RDL 182 formed using a patterning and metal deposition process such as sputtering, electrolytic plating, and electroless plating. Conductive layer 182 can be one or more layers of Al, Cu, Sn, Ni, Au, Ag, or other suitable electrically conductive material. One portion of conductive layer 182 extends into vias 176 for electrical connection to contact pads 132. Conductive layer 182 may partially or completely fill vias 176. Other portions of conductive layer 182 can be electrically common or electrically isolated depending on the design and function of semiconductor die 124.

The build-up interconnect structure 180 further includes an insulating or passivation layer 184 formed between conductive layers 182 for electrical isolation. The insulating layer 184 contains one or more layers of $SiO_2$, $Si_3N_4$, SiON, $Ta_2O_5$, $Al_2O_3$, or other material having similar insulating and structural properties. The insulating layer 184 is formed using PVD, CVD, printing, spin coating, spray coating, sintering or thermal oxidation. A portion of insulating layer 184 is removed by an etching process to expose conductive layer 182 for bump formation or additional package interconnect.

In FIG. 7e, an electrically conductive bump material is deposited over build-up interconnect structure 180 and electrically connected to conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above its melting point to form spherical balls or bumps 186. In some applications, bumps 186 are reflowed a second time to improve electrical contact to conductive layer 182. A UBM can be formed under bumps 186. The bumps can also be compression bonded to conductive layer 182. Bumps 186 represent one type of interconnect structure that can be formed over conductive layer 182. The interconnect structure can also use bond wires, stud bump, micro bump, or other electrical interconnect.

The encapsulant 174 and interconnect structure 180 are singulated using saw blade or laser cutting tool 187 into individual FO-WLCSP 188. FIG. 8 shows FO-WLCSP 188 after singulation. Semiconductor die 124 is electrically connected to conductive layer 182 of interconnect structures 180 and bumps 186. Sacrificial adhesive 134 is formed over contact pads 132 prior to mounting semiconductor die 124 to carrier 170 for encapsulation and formation of interconnect structure 180. Sacrificial adhesive 134 holds semiconductor die 124 securely in place, reducing lateral or vertical shifting of the die, while encapsulant 174 is deposited and cured. Active surface 130 is offset from interconnect structure 160 by a height of sacrificial adhesive 134. Sacrificial adhesive 134 is removed with carrier 180 but leaves behind via 176 as an opening through encapsulant 174 extending to contact pad 132. Conductive layer 182 is formed in via 176 to electrically connect semiconductor die 124 to interconnect structure 180 and bumps 186, without forming bumps over contact pads 132. Since conductive layer 182 is formed to extend to contact pads 132, no separate via formation is needed to make the electrical connection to the contact pads. The interconnect resistance is reduced by directly connecting conductive layer 182 to contact pads 132. By avoiding wafer-level bump formation over contact pads 132, wafer-level bump rework can be omitted. In addition, no solder-wettable contact pads are needed over the carrier to hold the semiconductor die in place during encapsulation, which saves manufacturing costs and reduces risk of bump cracking.

Figure 9A:
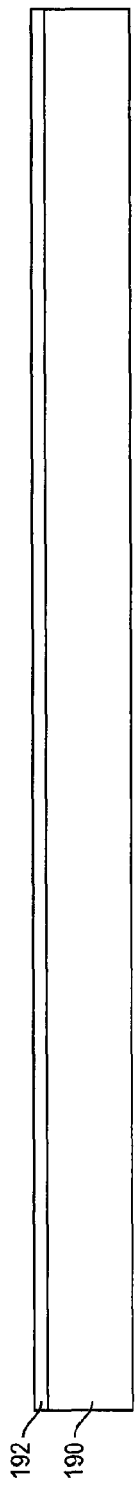
FIGS. 9a-9i illustrate forming the sacrificial adhesive and underfill material over the carrier and forming the conductive layer to extend to the contact pads.

FIGS. 9a-9i show another embodiment with a temporary substrate or carrier 190 containing sacrificial base material such as silicon, polymer, polymer composite, metal, ceramic, glass, glass epoxy, beryllium oxide, or other suitable low-cost, rigid material for structural support. An interface layer or tape 192 is applied over carrier 190 as a temporary adhesive bonding film releasable by heat or UV light, as shown in FIG. 9a.

Figure 9B:
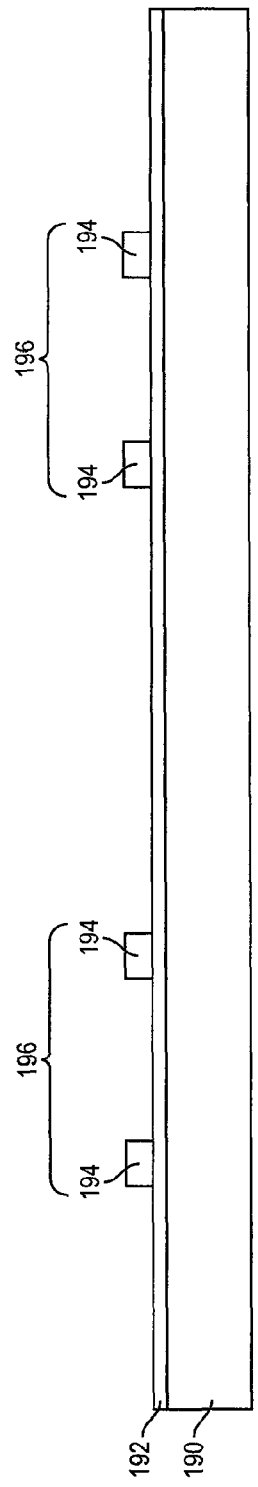

In FIG. 9b, a sacrificial adhesive 194, such as UV or heat releasable polymer adhesive, is deposited over interface layer 192 by screen printing or other suitable application process. Sacrificial adhesive 194 is disposed in an area 196 designed for mounting semiconductor die, more specifically in the area aligned with the contact pads of the semiconductor die.

Figure 9C:
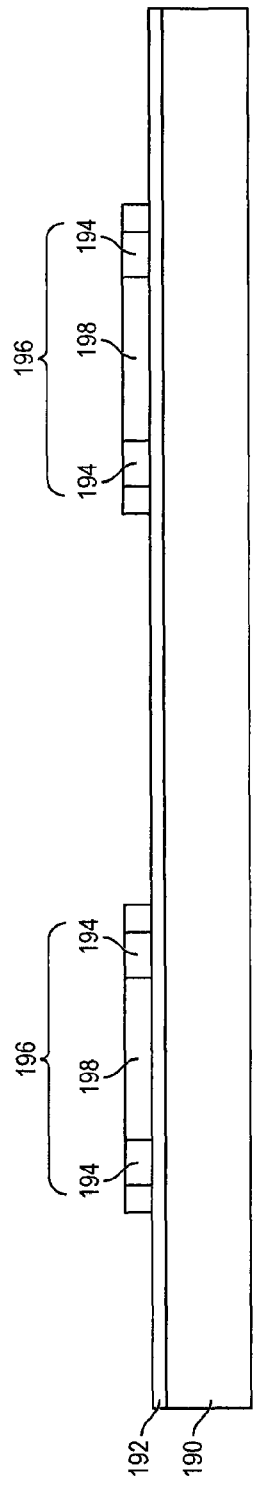

In FIG. 9c, an underfill material 198, such as epoxy resin, is deposited over area 196. The top surface of underfill material 198 and sacrificial adhesive 194 is planarized.

Figure 9D:
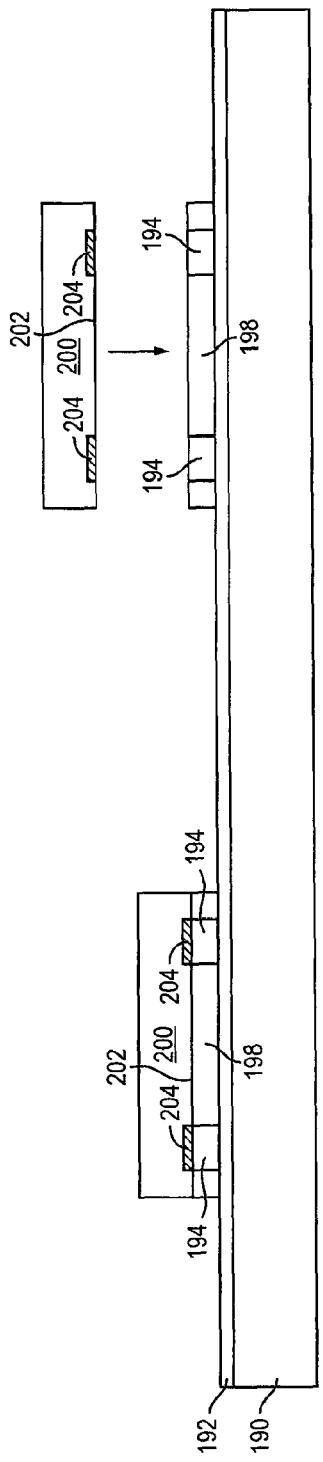

In FIG. 9d, a plurality of semiconductor die 200 each have an active surface 202 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 202 to implement analog circuits or digital circuits, such as DSP, ASIC, memory, or other signal processing circuit. Semiconductor die 200 may also contain IPDs, such as inductors, capacitors, and resistors, for RF signal processing. Semiconductor die 200 are formed on and singulated from a semiconductor wafer, similar to FIG. 3a.

An electrically conductive layer 204 is formed over active surface 202 using PVD, CVD, electrolytic plating, electroless plating process, or other suitable metal deposition process. Conductive layer 204 can be one or more layers of Al, Cu, Sn, Ni, Au, Ag, or other suitable electrically conductive material. Conductive layer 204 operates as contact pads electrically connected to the circuits on active surface 202.

Figure 9E:
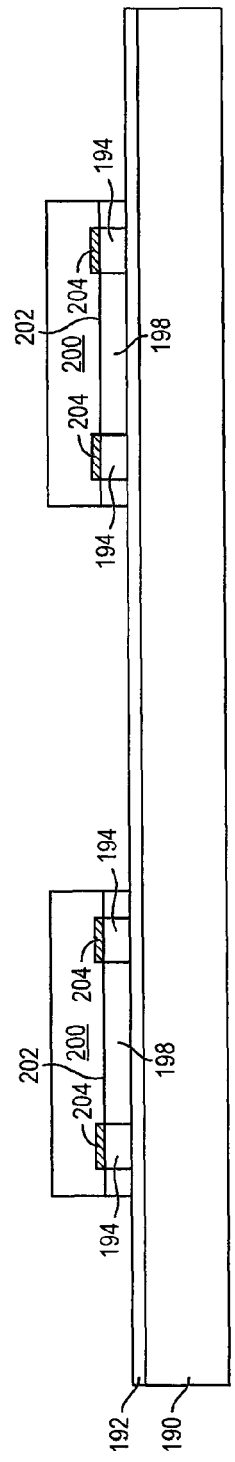

Each semiconductor die 200 is mounted over carrier 190 with active surface 202 oriented toward carrier 190 and contact pads 204 aligned with sacrificial adhesive 194. FIG. 9e shows all semiconductor die 200 mounted to carrier 190 with contact pads 204 aligned with sacrificial adhesive 194 and active surface 202 aligned to underfill material 198. Active surface 202 is offset from carrier 190 by a height of sacrificial adhesive 194. In one embodiment, sacrificial adhesive 194 has a height of 5-75 μm.

Figure 9F:
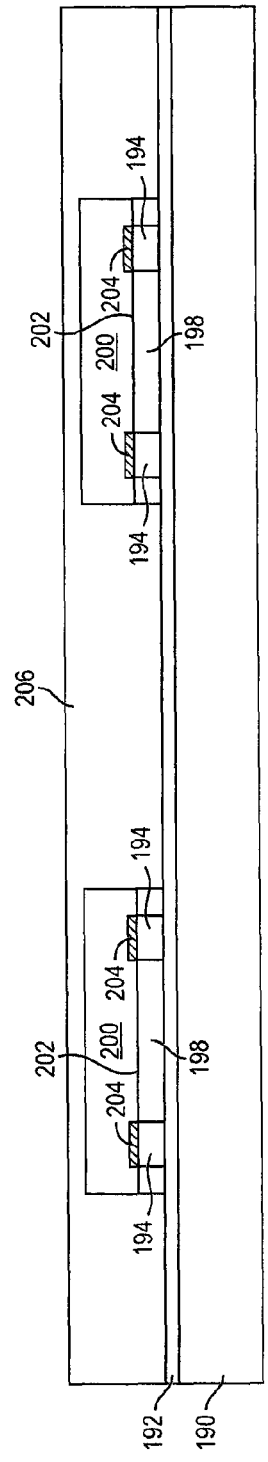

In FIG. 9f, an encapsulant or molding compound 206 is deposited over semiconductor die 200 and carrier 190 using a paste printing, compressive molding, transfer molding, liquid encapsulant molding, vacuum lamination, spin coating, or other suitable applicator. Encapsulant 206 can be polymer composite material, such as epoxy resin with filler, epoxy acrylate with filler, or polymer with proper filler. Encapsulant 206 is non-conductive and environmentally protects the semiconductor device from external elements and contaminants. Sacrificial adhesive 194 holds semiconductor die 200 securely in place, reducing lateral or vertical shifting of the die, while encapsulant 206 is deposited and cured.

Figure 9G:
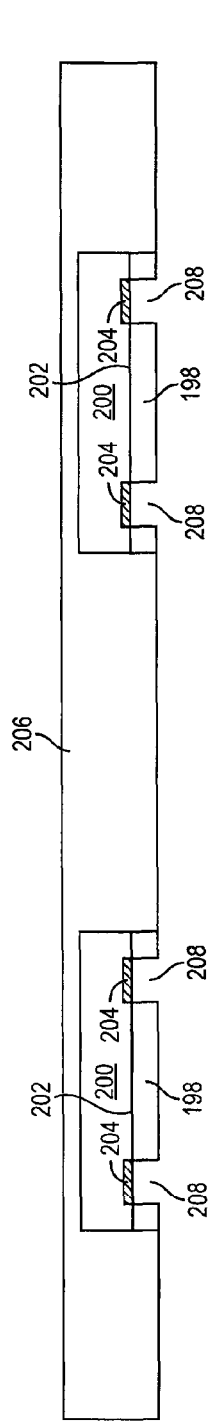

In FIG. 9g, carrier 190 and interface layer 192 are removed by UV light, thermal bake, chemical etching, mechanical peel-off, CMP, mechanical grinding, laser scanning, or wet stripping. Sacrificial adhesive 194 is also removed, leaving vias 208 which extend to contact pads 204.

Figure 9H:
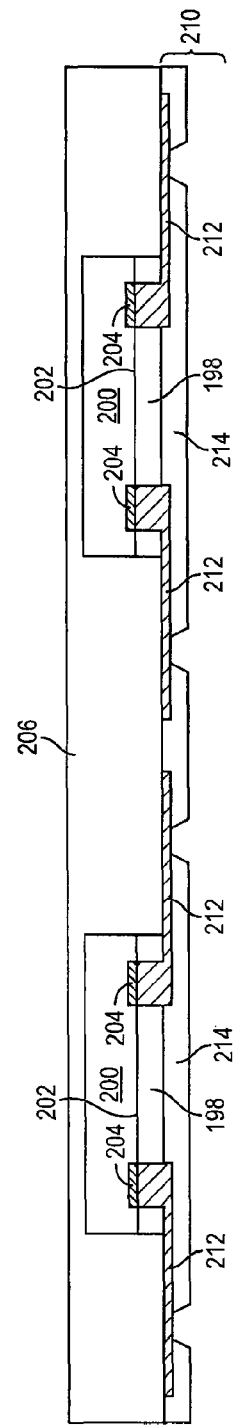

In FIG. 9h, a build-up interconnect structure 210 is formed over encapsulant 206 and underfill material 198. The build-up interconnect structure 210 includes an electrically conductive layer or RDL 212 formed using a patterning and metal deposition process such as sputtering, electrolytic plating, and electroless plating. Conductive layer 212 can be one or more layers of Al, Cu, Sn, Ni, Au, Ag, or other suitable electrically conductive material. One portion of conductive layer 212 extends into vias 208 for electrical connection to contact pads 204. Conductive layer 212 may partially or completely fill vias 208. Other portions of conductive layer 212 can be electrically common or electrically isolated depending on the design and function of semiconductor die 200.

The build-up interconnect structure 210 further includes an insulating or passivation layer 214 formed between conductive layers 212 for electrical isolation. The insulating layer 214 contains one or more layers of SiO2, Si3N4, SiON, Ta2O5, Al2O3, or other material having similar insulating and structural properties. The insulating layer 214 is formed using PVD, CVD, printing, spin coating, spray coating, sintering or thermal oxidation. A portion of insulating layer 214 is removed by an etching process to expose conductive layer 212 for bump formation or additional package interconnect.

Figure 9I:
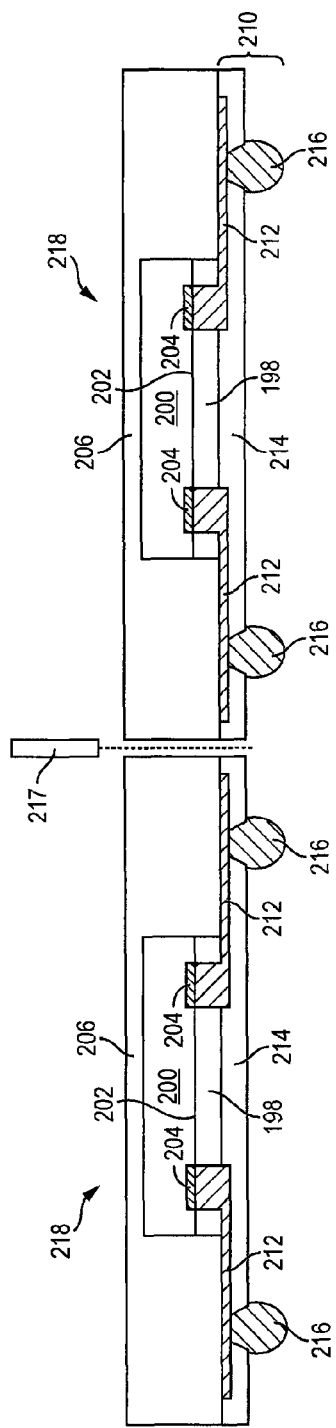

In FIG. 9i, an electrically conductive bump material is deposited over build-up interconnect structure 210 and electrically connected to conductive layer 212 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form spherical balls or bumps 216. In some applications, bumps 216 are reflowed a second time to improve electrical contact to conductive layer 212. A UBM can be formed under bumps 216. The bumps can also be compression bonded to conductive layer 212. Bumps 216 represent one type of interconnect structure that can be formed over conductive layer 212. The interconnect structure can also use bond wires, stud bump, micro bump, or other electrical interconnect.

The encapsulant 206 and interconnect structure 210 are singulated using saw blade or laser cutting tool 217 into individual FO-WLCSP 218, similar to FIG. 6.

Figure 10A:
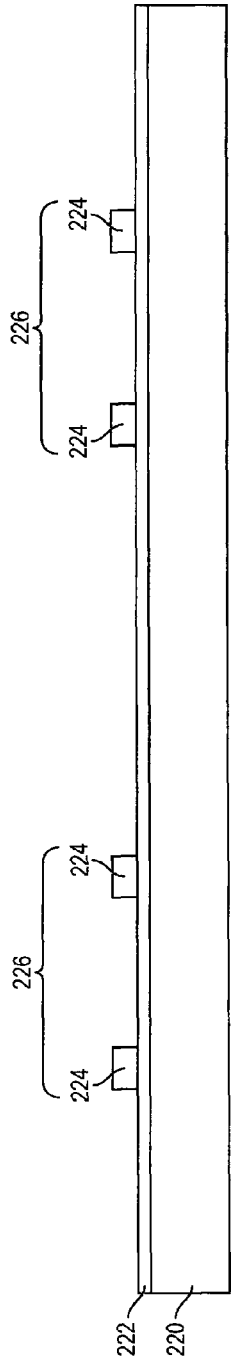

FIGS. 10a-10g show another embodiment with a temporary substrate or carrier 220 containing sacrificial base material such as silicon, polymer, polymer composite, metal, ceramic, glass, glass epoxy, beryllium oxide, or other suitable low-cost, rigid material for structural support. An interface layer or tape 222 is applied over carrier 220 as a temporary adhesive bonding film releasable by heat or UV light, as shown in FIG. 10a.

A sacrificial adhesive 224, such as UV or heat releasable polymer adhesive, is deposited over interface layer 222 by screen printing or other suitable application process. Sacrificial adhesive 224 is disposed in an area 226 designed for mounting semiconductor die, more specifically in the area aligned with the contact pads of the semiconductor die.

Figure 10B:
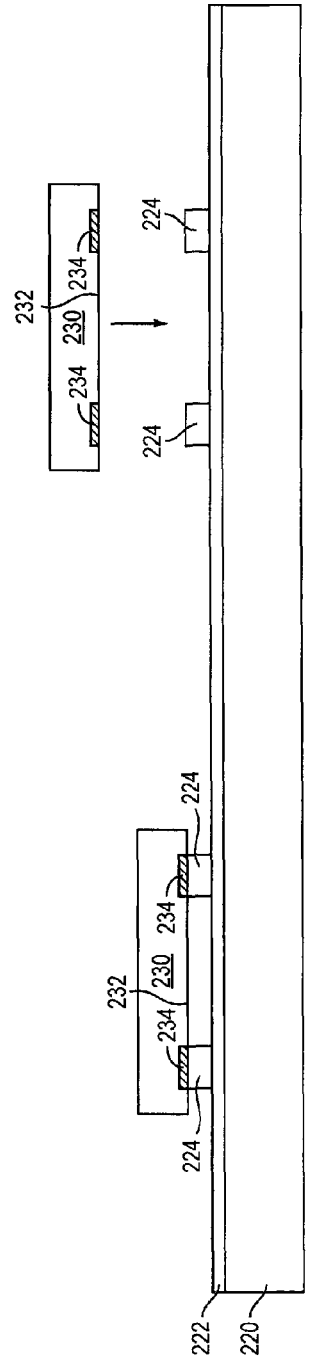

In FIG. 10b, a plurality of semiconductor die 230 each have an active surface 232 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as DSP, ASIC, memory, or other signal processing circuit. Semiconductor die 230 may also contain IPDs, such as inductors, capacitors, and resistors, for RF signal processing.

An electrically conductive layer 234 is formed over active surface 232 using PVD, CVD, electrolytic plating, electroless plating process, or other suitable metal deposition process. Conductive layer 234 can be one or more layers of Al, Cu, Sn, Ni, Au, Ag, or other suitable electrically conductive material. Conductive layer 234 operates as contact pads electrically connected to the circuits on active surface 232. Semiconductor die 234 are formed on and singulated from a semiconductor wafer, similar to FIG. 3a.

Figure 10C:
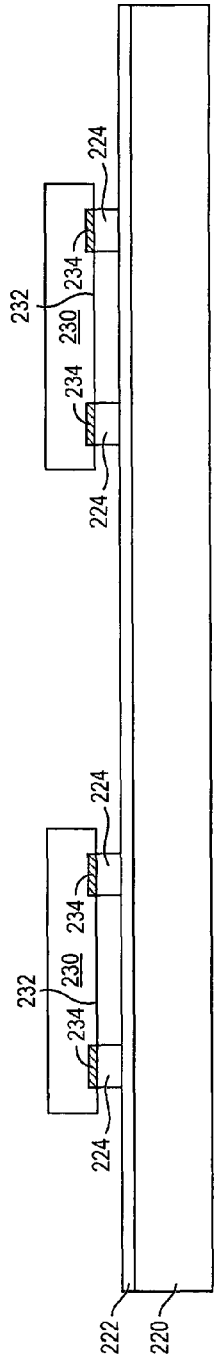

Each semiconductor die 230 is mounted over carrier 220 with active surface 232 oriented toward carrier 220 and contact pads 234 aligned with sacrificial adhesive 224. FIG. 10c shows all semiconductor die 220 mounted to carrier 220 with contact pads 234 aligned with sacrificial adhesive 224. Active surface 232 is offset from carrier 220 by a height of sacrificial adhesive 224. In one embodiment, sacrificial adhesive 224 has a height of 5-75 µm.

Figure 10D:
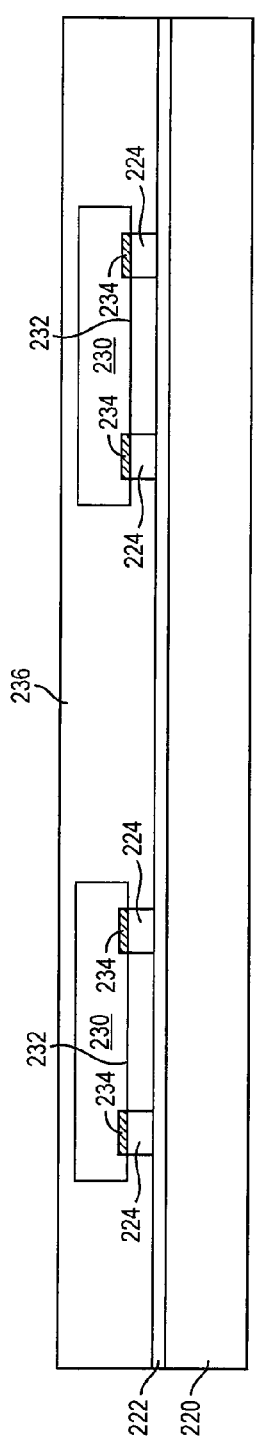

In FIG. 10d, an encapsulant or molding compound 236 is deposited over semiconductor die 230 and carrier 220 using a paste printing, compressive molding, transfer molding, liquid encapsulant molding, vacuum lamination, spin coating, or other suitable applicator. Encapsulant 236 can be polymer composite material, such as epoxy resin with filler, epoxy acrylate with filler, or polymer with proper filler. Encapsulant 236 is non-conductive and environmentally protects the semiconductor device from external elements and contaminants. Sacrificial adhesive 224 holds semiconductor die 230 securely in place, reducing lateral or vertical shifting of the die, while encapsulant 236 is deposited and cured.

Figure 10E:
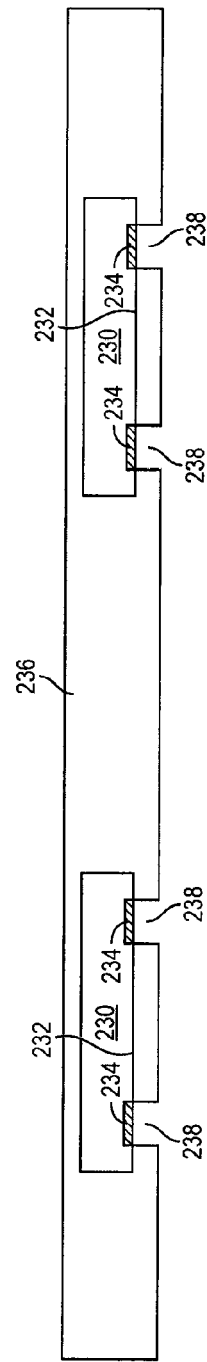

In FIG. 10e, carrier 220 and interface layer 222 are removed by UV light, thermal bake, chemical etching, mechanical peel-off, CMP, mechanical grinding, laser scanning, or wet stripping. Sacrificial adhesive 224 is also removed, leaving vias 238 which extend to contact pads 234.

Figure 10F:
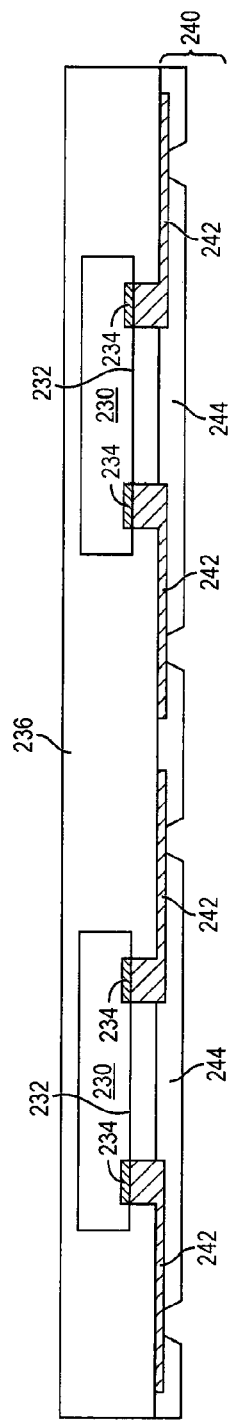

In FIG. 10f, a build-up interconnect structure 240 is formed over encapsulant 236. The build-up interconnect structure 240 includes an electrically conductive layer or RDL 242 formed using a patterning and metal deposition process such as sputtering, electrolytic plating, and electroless plating. Conductive layer 242 can be one or more layers of Al, Cu, Sn, Ni, Au, Ag, or other suitable electrically conductive material. One portion of conductive layer 242 extends into vias 238 for electrical connection to contact pads 204. Conductive layer 242 may partially or completely fill vias 238. Other portions of conductive layer 242 can be electrically common or electrically isolated depending on the design and function of semiconductor die 230.

The build-up interconnect structure 240 further includes an insulating or passivation layer 244 formed between conductive layers 242 for electrical isolation. The insulating layer 244 contains one or more layers of SiO2, Si3N4, SiON, Ta2O5, Al2O3, or other material having similar insulating and structural properties. The insulating layer 244 is formed using PVD, CVD, printing, spin coating, spray coating, sintering or thermal oxidation. A portion of insulating layer 244 is removed by an etching process to expose conductive layer 242 for bump formation or additional package interconnect.

In FIG. 10g, an electrically conductive bump material is deposited over build-up interconnect structure 240 and electrically connected to conductive layer 242 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 242 using a suitable attachment or bonding process. In one embodiment, the bump material is reflowed by heating the material above its melting point to form spherical balls or bumps 246. In some applications, bumps 246 are reflowed a second time to improve electrical contact to conductive layer 242. A UBM can be formed under bumps 246. The bumps can also be compression bonded to conductive layer 242. Bumps 246 represent one type of interconnect structure that can be formed over conductive layer 242. The interconnect structure can also use bond wires, stud bump, micro bump, or other electrical interconnect.

The encapsulant 236 and interconnect structure 240 are singulated using saw blade or laser cutting tool 247 into individual FO-WLCSP 248, similar to FIG. 8.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer containing a plurality of semiconductor die each including a plurality of contact pads;
   depositing a sacrificial adhesive over the contact pads;
   forming an underfill material over the semiconductor die between the sacrificial adhesive;
   planarizing the underfill material and sacrificial adhesive;
   singulating the semiconductor wafer to separate the semiconductor die;
   depositing an encapsulant over the semiconductor die;
   removing the sacrificial adhesive to expose the contact pads while retaining the underfill material; and
   forming an interconnect structure over the encapsulant, the interconnect structure including a conductive layer that extends to the contact pads.

2. The method of claim 1, further including disposing the semiconductor die with a surface of the semiconductor die offset from the interconnect structure by a height of the sacrificial adhesive.

3. The method of claim 1, wherein the conductive layer completely fills an area over the contact pads.

4. The method of claim 1, wherein the sacrificial adhesive includes ultraviolet or heat releasable polymer adhesive.

5. The method of claim 1, further including forming a bump over the conductive layer.

6. A method of making a semiconductor device, comprising:
   providing a semiconductor die including a contact pad;

disposing an underfill material over the semiconductor die;
depositing a sacrificial adhesive over the contact pad;
planarizing the underfill material and sacrificial adhesive with opposing surfaces of the underfill material respectively coplanar with opposing surfaces of the sacrificial adhesive;
depositing an encapsulant over the semiconductor die;
removing the sacrificial adhesive to expose the contact pad while leaving the underfill material disposed over the semiconductor die; and
forming an interconnect structure over the encapsulant, the interconnect structure including a conductive layer that extends to the contact pad.

7. The method of claim 6, further including disposing the semiconductor die with a surface of the semiconductor die offset from the interconnect structure by a height of the sacrificial adhesive.

8. The method of claim 6, wherein the conductive layer completely fills an area over the contact pad.

9. The method of claim 6, wherein the sacrificial adhesive includes ultraviolet or heat releasable polymer adhesive.

10. The method of claim 6, further including forming a bump over the conductive layer.

11. A method of making a semiconductor device, comprising:
providing a semiconductor die including a contact pad;
disposing a sacrificial adhesive only over the contact pad;
forming an underfill material over the semiconductor die;
depositing an encapsulant over the semiconductor die;
removing the sacrificial adhesive to expose the contact pad, wherein removing the sacrificial adhesive leaves the underfill material over the semiconductor die; and
forming an interconnect structure over the encapsulant and electrically coupled to the contact pad.

12. The method of claim 11, wherein the sacrificial adhesive includes ultraviolet or heat releasable polymer adhesive.

13. The method of claim 11, wherein forming the interconnect structure includes:
forming a conductive layer over the encapsulant; and
forming a bump over the conductive layer.

14. The method of claim 13, wherein forming the conductive layer includes completely filling an area over the contact pad.

15. The method of claim 11, further including planarizing the underfill material and sacrificial adhesive.

16. The method of claim 11, further including disposing the semiconductor die with a surface of the semiconductor die offset from the interconnect structure by a height of the sacrificial adhesive.

17. A method of making a semiconductor device, comprising:
providing a semiconductor die including a contact pad;
depositing a sacrificial adhesive over an area of the semiconductor die consisting essentially of the contact pad while leaving a portion of an active surface of the semiconductor die devoid of sacrificial adhesive;
depositing an encapsulant over the semiconductor die;
removing the sacrificial adhesive to expose the contact pads; and
forming an interconnect structure over the encapsulant and electrically coupled to the contact pad.

18. The method of claim 17, further including:
forming an underfill material over the semiconductor die; and
planarizing the underfill material and sacrificial adhesive.

19. The method of claim 17, further including disposing the semiconductor die with the active surface of the semiconductor die offset from the interconnect structure by a height of the sacrificial adhesive.

20. The method of claim 17, wherein forming the interconnect structure includes forming a conductive layer to completely fill the area of the semiconductor die.

21. The method of claim 17, wherein the sacrificial adhesive includes ultraviolet or heat releasable polymer adhesive.

22. A method of making a semiconductor device, comprising:
providing a semiconductor die including a contact pad;
disposing an underfill material over the semiconductor die;
removing the underfill material over the contact pad;
depositing a sacrificial adhesive over the contact pad with opposing surfaces of the underfill material respectively coplanar with opposing surfaces of the sacrificial adhesive;
depositing an encapsulant over the semiconductor die; and
removing the sacrificial adhesive to expose the contact pad.

23. The method of claim 22, further including:
forming an interconnect structure over the encapsulant, the interconnect structure including a conductive layer that extends to the contact pad; and
disposing the semiconductor die with a surface of the semiconductor die offset from the interconnect structure by a height of the sacrificial adhesive.

24. The method of claim 22, wherein the sacrificial adhesive includes ultraviolet or heat releasable polymer adhesive.

25. The method of claim 22, further including forming a conductive layer completely filling an area over the contact pad.

26. The method of claim 25, further including forming a bump over the conductive layer.

27. The method of claim 22, further including disposing the underfill material between a carrier and an active surface of the semiconductor die.

\* \* \* \* \*